US009827594B2

(12) United States Patent
Moon et al.

(10) Patent No.: US 9,827,594 B2
(45) Date of Patent: Nov. 28, 2017

(54) VIBRATION GENERATING DEVICE

(71) Applicant: Samsung Electro-Mechanics Co., Ltd., Suwon-si (KR)

(72) Inventors: Dong Su Moon, Suwon-si (KR); Yeon Ho Son, Suwon-si (KR); Kyung Su Park, Suwon-si (KR); Joon Choi, Suwon-si (KR); Hwa Young Oh, Suwon-si (KR)

(73) Assignee: MPLUS CO., LTD., Suwon-si, Gyeonggi-Do (KR)

( * ) Notice: Subject to any disclaimer, the term of this patent is extended or adjusted under 35 U.S.C. 154(b) by 410 days.

(21) Appl. No.: 14/645,660

(22) Filed: Mar. 12, 2015

(65) Prior Publication Data

US 2016/0096198 A1 Apr. 7, 2016

(30) Foreign Application Priority Data

Oct. 1, 2014 (KR) ........................ 10-2014-0132279

(51) Int. Cl.
*H01L 41/04* (2006.01)
*B06B 1/14* (2006.01)
*B06B 1/06* (2006.01)

(52) U.S. Cl.
CPC .............. *B06B 1/14* (2013.01); *B06B 1/0648* (2013.01); *H01L 41/04* (2013.01)

(58) Field of Classification Search
CPC ... H01L 41/053; H01L 41/08; H01L 41/0926; H01L 41/0933; H01L 41/094
USPC ......................... 310/328, 329, 348, 351, 355
See application file for complete search history.

(56) References Cited

U.S. PATENT DOCUMENTS 6,323,581 B1 * 11/2001 Powell ................. H01H 71/127 310/328
2012/0026103 A1 * 2/2012 Woo ..................... H02N 2/0055 345/173
2012/0248935 A1 * 10/2012 Liu ..................... H01L 41/0933 310/326
2013/0293069 A1 11/2013 Sakaguchi et al.

FOREIGN PATENT DOCUMENTS

JP 2009-222019 A 10/2009
JP 2010-119128 A 5/2010
JP 2012-200077 A 10/2012
JP 2013-080768 A 5/2013
KR 10-1997-0700389 A 1/1997
KR 10-2012-0117547 A 10/2012
WO 2012/105368 A1 8/2012

OTHER PUBLICATIONS

KIPO Office Action for Korean Patent Application No. 10-2014-0132279.

* cited by examiner

*Primary Examiner* — Derek Rosenau
(74) *Attorney, Agent, or Firm* — LRK Patent Law Firm

(57) ABSTRACT

There is provided a vibration generating device including: a housing having an internal space; a vibration member having one end fixedly attached to the housing; a piezoelectric element installed on the vibration member; and a mass body fixedly attached to the vibration member, wherein the vibration member includes an installation part on which the piezoelectric element is installed, and an extension part extended from at least one side surface of the installation part, and a maximum displacement portion of the vibration member is changed depending on a vibration mode.

10 Claims, 4 Drawing Sheets

VIBRATION GENERATING DEVICE

CROSS-REFERENCE TO RELATED APPLICATION

This application claims the priority and benefit of Korean Patent Application No. 10-2014-0132279 filed on Oct. 1, 2014, with the Korean Intellectual Property Office, the disclosure of which is incorporated herein by reference.

BACKGROUND

The present disclosure relates to a vibration generating device.

A vibration generating device, a component converting electric energy into mechanical vibrations using the principle of the generation of electromagnetic force, is mounted in a mobile phone, or the like, to silently notify a user of call reception.

Recently, vibration generating devices using a piezoelectric element have been used. Such vibration generating devices use the principle of a converse piezoelectric effect, in which displacement of the piezoelectric element is generated when a voltage is applied to the piezoelectric element, and vibration force is generated by the movement of amass body of the vibration generating device due to the generated displacement.

However, in general, the piezoelectric element is formed to have a rectangular parallelepiped shape, in which a length of the piezoelectric element is greater than a width thereof. In this case, since displacement and vibration force may only be secured when piezoelectric element is relatively long, a total length of the vibration generating device may be increased, whereby there is a limitation in miniaturizing and thinning the vibration generating device.

RELATED ART DOCUMENT (Patent Document 1) Japanese Patent Laid-Open Publication No. 2012-200077

SUMMARY

An aspect of the present disclosure may provide a vibration generating device capable of preventing a decrease in response speed even when the vibration generating device is driven in a plurality of vibration modes.

According to an aspect of the present disclosure, a vibration generating device may include: a housing having an internal space; a vibration member having one end fixedly attached to the housing; a piezoelectric element installed on the vibration member; and a mass body fixedly attached to the vibration member, wherein the vibration member includes an installation part on which the piezoelectric element is installed, and an extension part extended from at least one side surface of the installation part, and a maximum displacement portion of the vibration member is changed depending on a vibration mode.

BRIEF DESCRIPTION OF DRAWINGS

The above and other aspects, features and advantages of the present disclosure will be more clearly understood from the following detailed description taken in conjunction with the accompanying drawings, in which.

DETAILED DESCRIPTION

Figure 1:
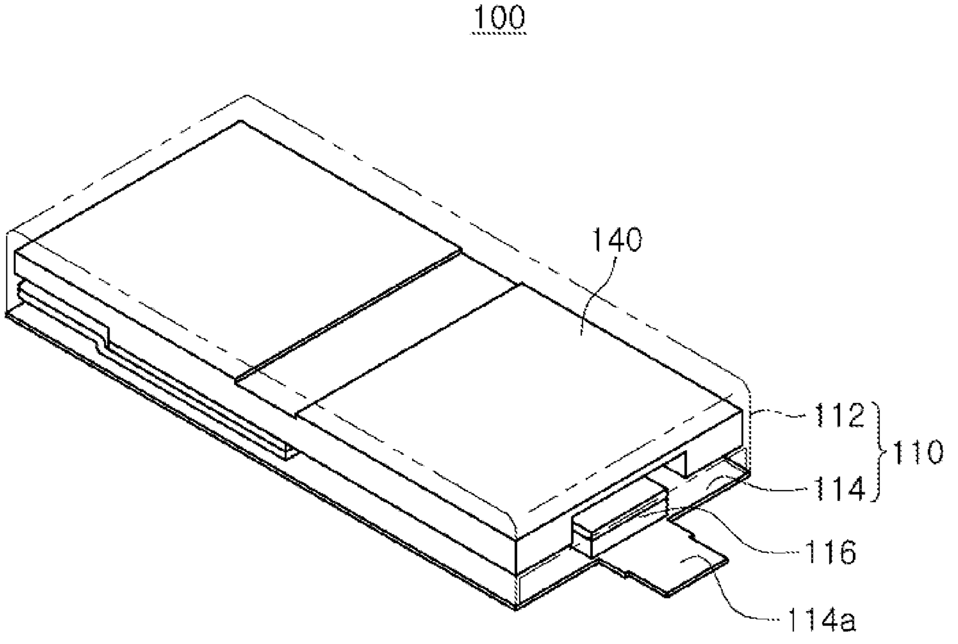
FIG. 1 is a schematic perspective view of a vibration generating device according to an exemplary embodiment of the present disclosure.

Exemplary embodiments of the present disclosure will now be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Figure 2:
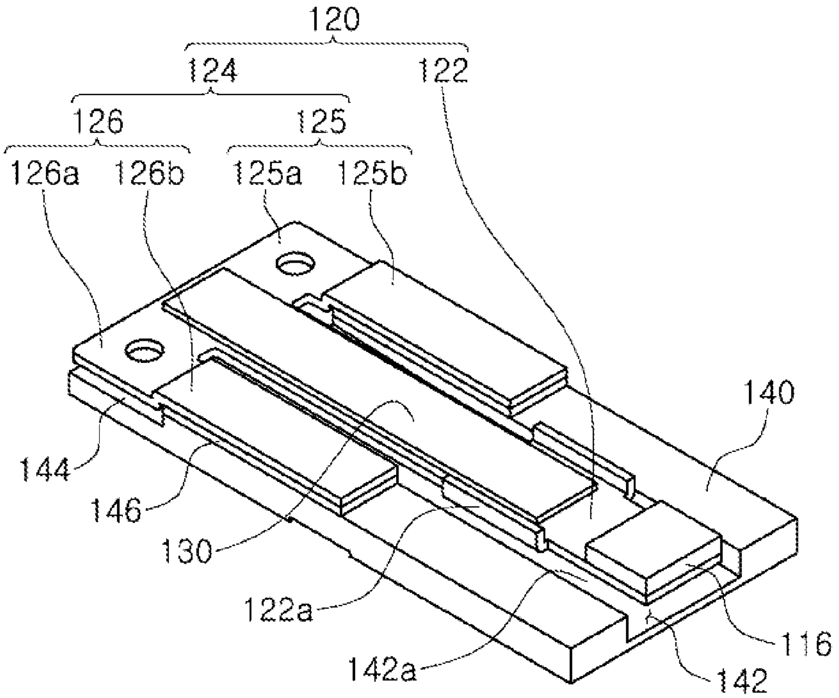
FIG. 2 is a bottom perspective view of the vibration generating device, without a housing, according to an exemplary embodiment of the present disclosure.

FIG. 1 is a schematic perspective view of a vibration generating device according to an exemplary embodiment of the present disclosure, and FIG. 2 is a bottom perspective view of the vibration generating device, without a housing, according to an exemplary embodiment of the present disclosure.

Referring to FIGS. 1 and 2, a vibration generating device 100 according to an exemplary embodiment of the present disclosure may include, for example, a housing 110, a vibration member 120, a piezoelectric element 130, and a mass body 140.

The housing 110 may have an internal space so that the vibration member 120, the piezoelectric element 130, and the mass body 140 may be installed therein. For example, the housing 110 may include a case 112 having a box shape in which a lower end thereof is opened, and a bracket 114 coupled to the lower end of the case 112.

The bracket 114 may have a plate shape, and a board seating part 114*a* for seating a circuit board at the time of leading the circuit board (not shown) connected to the piezoelectric element 130.

Further, an installation member 116 for installing the vibration member 120 may be provided at the housing 110. The installation member 116 may be installed at one end portion of the bracket 114 and have a rectangular parallelepiped block shape.

Meanwhile, although the case in which the housing 110 has a rectangular parallelepiped shape is described in the present exemplary embodiment by way of example, the present inventive concept is not limited thereto. That is, a shape of the housing 110 may be changed.

Here, defining terms with respect to a length direction, a width direction, and a thickness direction, as viewed in FIG. 1, the length direction refers to an X direction, the width direction refers to a Y direction, and the thickness direction refers to a z direction.

One end of the vibration member 120 may be fixedly attached to the housing 110. As an example, one end of the vibration member 120 may be fixedly attached to the installation member 116 installed at the bracket 114. That is, the vibration member 120 may be installed in the housing 110 to have a cantilever structure.

Further, the vibration member 120 may have a shape in which a maximum displacement portion is changed depending on a vibration mode. The detailed description thereof will be provided below.

Meanwhile, the vibration member 120 may include an installation part 122 on which the piezoelectric element 130 is installed and an extension part 124 extended from at least one side surface of the installation part 122.

One end of the installation part 122 is fixedly attached to the installation member 116 of the housing 110. Meanwhile, the piezoelectric element 130 may be fixedly attached to a bottom surface of the installation part 122, and the installation part 122 may include a support protrusion **122*a* supporting some region of both side surfaces of the piezoelectric element 130**.

Meanwhile, the installation part 122 may mean a portion to which the piezoelectric element 130 is bonded and installed, and may have a rectangular plate shape. That is, the installation part 122 may have a shape corresponding to the piezoelectric element 130.

The extension part 124 may include a first extension part 125 extended from one side surface of the installation part 122 and a second extension part 126 extended from the other side surface of the installation part 122. As an example, the extension part 124 may have a symmetric shape based on a central line of the installation part 122 in the width direction. In other words, the extension part 124 may be extended from both side surfaces of the installation part 122, for example, from both side surfaces of the other end portion of the installation part 122.

The first extension part 125 may be composed of a first width direction extension plate **125*a* extended from one side surface of the other end portion of the installation part 122 and a first length direction extension plate 125*b* extended from a distal end of the first width direction extension plate 125*a* in a length direction of the installation part 122**.

Further, the second extension plate 126 may be composed of a second width direction extension plate **126*a* extended from the other side surface of the other end portion of the installation part 122 and a second length direction extension plate 126*b* extended from a distal end of the second width direction extension plate 126*a* to be parallel with respect to the first length direction extension plate 125*b***.

Figure 3:
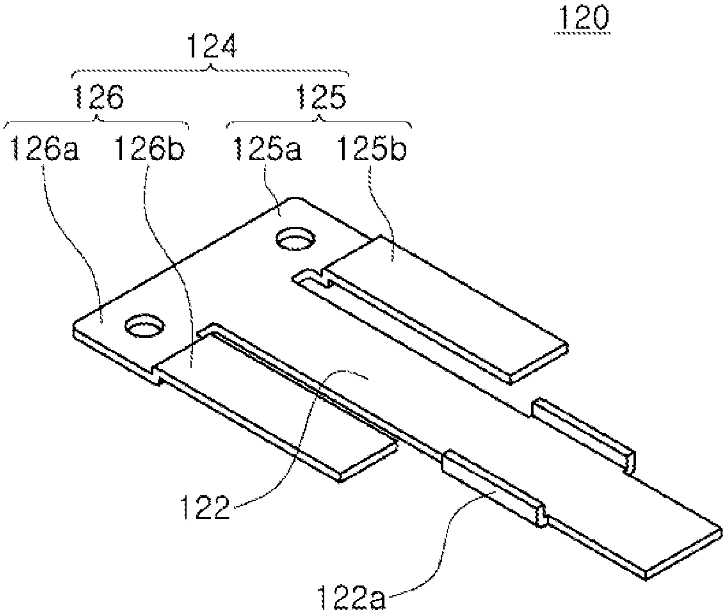
FIG. 3 is a bottom perspective view of a vibration member provided in the vibration generating device according to an exemplary embodiment of the present disclosure.

Meanwhile, as shown in more detail in FIG. 3, the first and second length direction extension plates **125*b* and 126*b* may be formed to have step portions. That is, the first and second length direction extension plates 125*b* and 126*b* may be formed to have step portions in order to be bonded to and installed on the mass body 140**.

In addition, as described above, the vibration member 120 may be vibrated by deformation of the piezoelectric element 130, and a vibration state of the vibration member 120 may be changed depending on the vibration mode. As an example, the vibration mode may be composed of first and second vibration modes, and in the first vibration mode, the vibration member 120 may be vibrated at a first resonance frequency, and in the second vibration mode, the vibration member 120 may be vibrated at a second resonance frequency.

As an example, in the case in which the vibration member 120 is vibrated at the first resonance frequency, a maximum displacement portion of the vibration member 120 may be the other end portion of the installation part 122. Further, in the case in which the vibration member 120 is vibrated at the second resonance frequency, the maximum displacement portion of the vibration member 120 may be distal ends of the first and second length direction extension plates **125*b* and 126*b***.

Meanwhile, a difference between the first and second resonance frequencies may be 50 Hz or more. Further, the first resonance frequency in the first vibration mode and the second resonance frequency in the second vibration mode may be in a range of 50 Hz to 400 Hz. In addition, the first resonance frequency may be lower than the second resonance frequency.

As described above, vibration may be implemented in a plurality of vibration modes through the vibration member 120 composed of the installation part 122 and the extension part 124. In addition, a portion formed to be bent is not provided in the installation part 122 and the extension part 124, a decrease in the response speed may be prevented. Further, a decrease in a length of the vibration member 120 may be prevented, such that a decrease in a vibration amount may be prevented.

In other words, miniaturization and thinness of the vibration generating device 100 may be implemented, and at the same time, the decrease in the response speed may be prevented. In addition, vibration may be generated in the plurality of vibration modes.

The piezoelectric element 130 may be fixedly attached to the vibration member 120. As an example, the piezoelectric element 130 may be fixed installed to the bottom surface of the installation part 122 of the vibration member 120 and have a bar shape. Further, in the case in which the piezoelectric element 130 is installed on the installation part 122, both side surfaces of the piezoelectric element 130 may be supported by the support protrusion **122*a***.

Meanwhile, the piezoelectric element 130 may be connected to the circuit board (not shown) and allow the vibration member 120 and the mass body 140 to be vibrated in the plurality of vibration modes. As an example, the vibration member 120 and the mass body 140 may be vibrated in two vibration modes depending on a deformation mode of the piezoelectric element 130.

The mass body 140 may be fixedly attached to the vibration member 120. As an example, the mass body 140 may be installed on an upper surface of the vibration member 120. Meanwhile, the mass body 140 may have a substantially rectangular parallelepiped shape.

Figure 4:
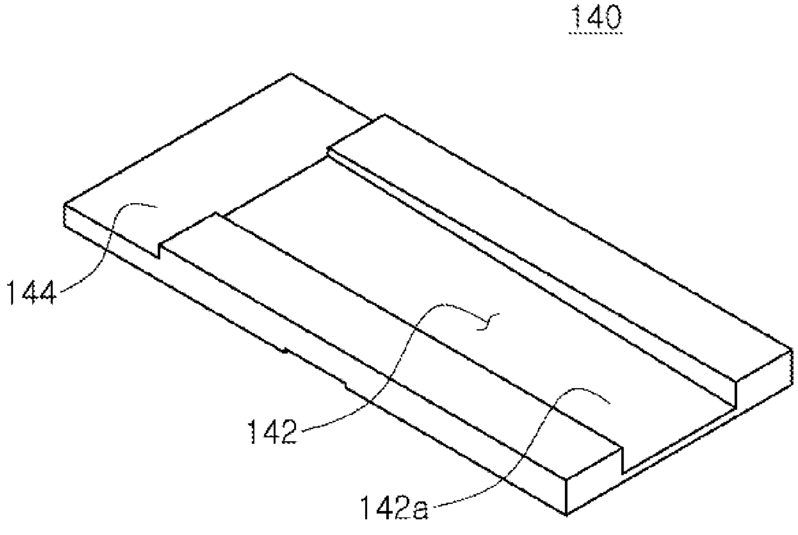
FIG. 4 is a bottom perspective view of amass body provided in the vibration generating device according to an exemplary embodiment of the present disclosure.

In addition, as shown in FIG. 4, an insertion groove 142 into which the installation part 122 is inserted may be formed in a bottom surface of the mass body 140, and the bottom surface **142*a* of the mass body 140 forming the insertion groove 142 may be inclined upwardly from a free end of the installation part 122 toward a fixed end thereof so as to prevent a contact with the installation part 122**.

However, the present inventive concept is not limited thereto, but the bottom surface **142*a* of the mass body 140 forming the insertion groove 142 may be shaped to have a step portion. In this case, the bottom surface 142*a* may be formed so that a portion disposed to face one end portion of the installation part 122 has a long spaced distance from the installation part 122**.

Further, a stepped surface 144 for preventing a contact with the vibration member 120 may be formed at the other end portion of the bottom surface of the mass body 140 as shown in FIG. 4.

Meanwhile, the mass body 140 may be bonded to the first and second length direction extension plates 125*b* and 126*b* to thereby be fixedly attached to the vibration member 120. For example, the mass body 140 may be bonded to the first and second length direction extension plates 125*b* and 126*b* via an adhesive member 146.

As described above, the bottom surface of the mass body 140 may be bonded to the vibration member 120 at portions thereof facing the first and second length direction extension plates 125*b* and 126*b* and spaced from the vibration member 120 at the other portions thereof.

As described above, in the vibration generating device, as vibration is implemented in the plurality of vibration modes, the decrease in the response speed may be prevented. Further, a decrease in the vibration amount caused by miniaturization and thinness may be suppressed.

Hereinafter, an operation of the vibration generating device according to an exemplary embodiment of the present disclosure will be described with reference to the accompanying drawings.

Figure 5:
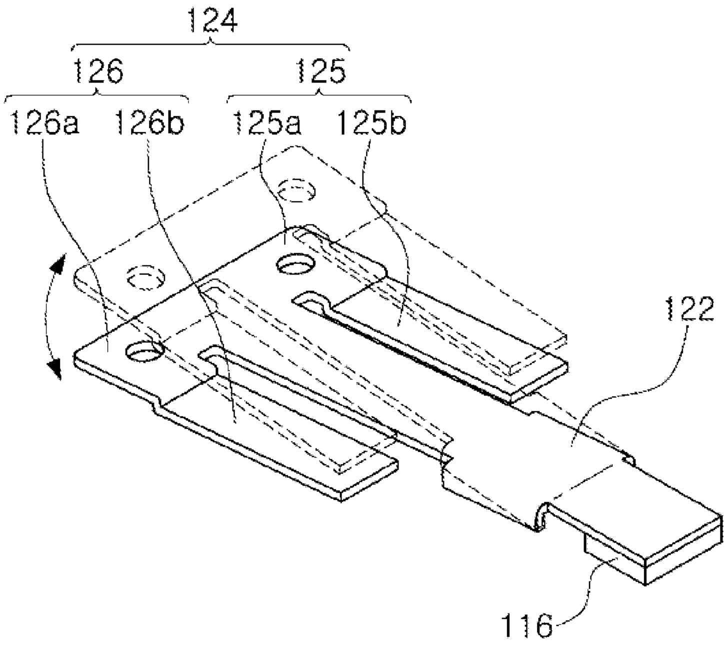
FIGS. 5 and 6 are views illustrating an operation of the vibration member according to an exemplary embodiment of the present disclosure.
Figure 6:
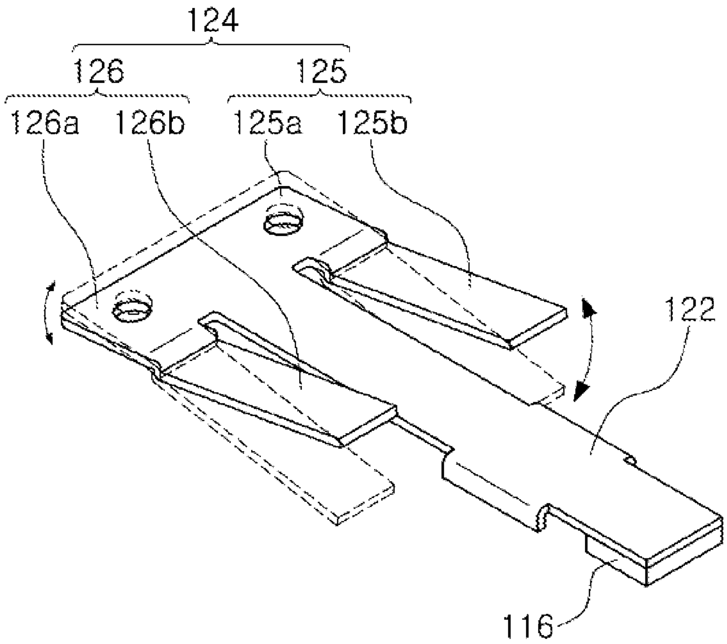

FIGS. 5 and 6 are views illustrating an operation of the vibration member according to an exemplary embodiment of the present disclosure. That is, FIG. 5 is a view illustrating a case in which the vibration member according to an exemplary embodiment of the present disclosure is driven in a first vibration mode, and FIG. 6 is a view illustrating a case in which the vibration member according to an exemplary embodiment of the present disclosure is driven in a second vibration mode.

Referring to FIG. 5, the vibration member 120 may have a cantilever structure in which one end of the installation part 122 is fixedly attached to the installation member 116. Meanwhile, in the case in which the vibration member 120 is vibrated in the first vibration mode by the piezoelectric element 130 (see FIG. 2), the vibration member 120 may be vertically vibrated in a state in which one end of the installation part 122 of the vibration member 120 is fixed.

In this case, as shown in FIG. 5, the other end of the installation part 122 may become the maximum displacement portion.

Meanwhile, the resonance frequency in the first vibration mode may be in a range of 50 Hz to 400 Hz.

Further, referring to FIG. 6, in the case in which the vibration member 120 is vibrated in the second vibration mode by the piezoelectric member 130, a vibration amount of the extension plate 124 in a vertical direction may be larger than a vibration amount than that of the installation part 122, such that the distal end of the extension part 124 of the vibration member may become the maximum displacement portion.

Meanwhile, the resonance frequency in the second vibration mode may be in a range of 50 Hz to 400 Hz, and the difference between the first and second resonance frequencies may be 50 Hz or more. In addition, the resonance frequency in the first vibration mode is lower than that in the second vibration mode.

As described above, the vibration member 120 may include the installation part 122 and the extension part 124, such that the vibration member 120 may be vibrated in the first and second vibration modes.

Further, since extended from at least one side surface of the installation part 122 and the installation part 122 and the extension part 124 are disposed on the same plane, a decrease in the response speed may be prevented.

In other word, a decrease in the response speed generated in the case in which the extension part 124 is bent from the installation part may be prevented.

Hereinafter, a vibration generating device according to another exemplary embodiment of the present disclosure will be described with reference to the accompanying drawings.

Figure 7:
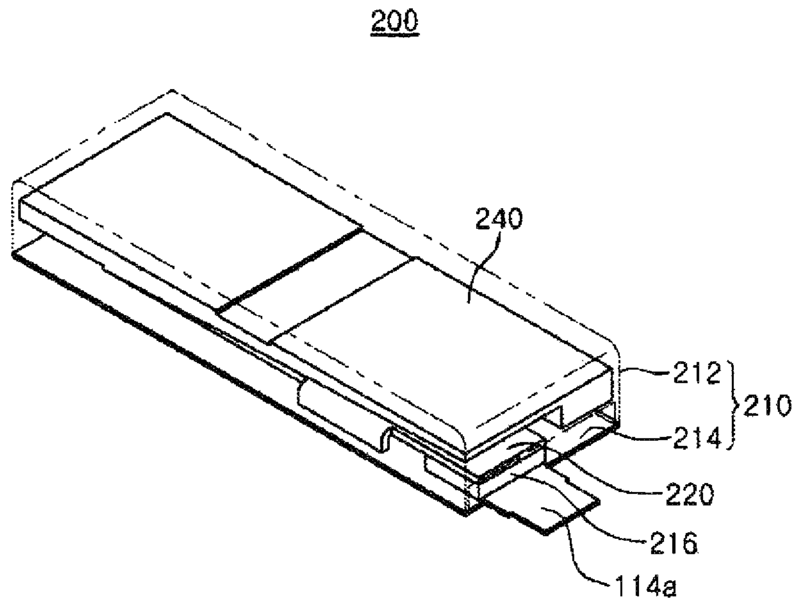
FIG. 7 is a schematic perspective view of a vibration generating device according to another exemplary embodiment of the present disclosure.
Figure 8:
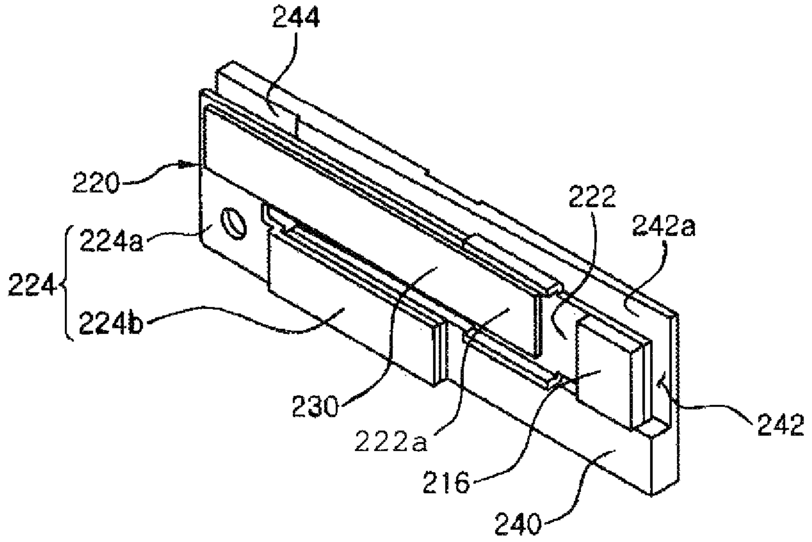
FIG. 8 is a bottom perspective view of the vibration generating device, without a housing, according to another exemplary embodiment of the present disclosure.

FIG. 7 is a schematic perspective view of a vibration generating device according to another exemplary embodiment of the present disclosure, and FIG. 8 is a bottom perspective view of the vibration generating device, without a housing, according to another exemplary embodiment of the present disclosure.

Referring to FIGS. 7 and 8, a vibration generating device 200 according to another exemplary embodiment of the present disclosure may include, for example, a housing 210, a vibration member 220, a piezoelectric element 230, and a mass body 240.

The housing 210 may have an internal space so that the vibration member 220, the piezoelectric element 230, and the mass body 240 may be installed therein. For example, the housing 210 may include a case 212 having a box shape in which a lower end thereof is opened, and a bracket 214 coupled to the lower end of the case 212.

The bracket 214 may have a plate shape. Further, an installation member 216 for installing the vibration member 220 may be provided at the housing 210. The installation member 216 may be installed at one end portion of the bracket 214 and have a rectangular parallelepiped block shape.

The vibration member 220 may have one end fixedly attached to the housing 210. As an example, one end of the vibration member 220 may be fixedly attached to the installation member 216 installed at the bracket 214. That is, the vibration member 220 may be installed in the housing 210 to have a cantilever structure.

Further, the vibration member 220 may have a shape in which a maximum displacement portion is changed depending on a vibration mode. The detailed description thereof will be provided below.

Meanwhile, the vibration member 220 may include an installation part 222 on which the piezoelectric element 230 is installed and an extension part 224 extended from one side surface of the installation part 222.

One end of the installation part 222 is fixedly attached to the installation member 216 of the housing 210. Meanwhile, the piezoelectric element 230 may be fixedly attached to a bottom surface of the installation part 222, and the installation part 222 may include a support protrusion 222*a* supporting some region of both side surfaces of the piezoelectric element 230.

Meanwhile, the installation part 222 may mean a portion to which the piezoelectric element 230 is bonded and installed, and may have a rectangular plate shape. That is, the installation part 222 may have a shape corresponding to the piezoelectric element 230.

The extension part 224 may be composed of a width direction extension plate 224*a* extended from one side surface of the other end portion of the installation part 222 and a length direction extension plate 224*b* extended from a distal end of the width direction extension plate 224*a* in a length direction of the installation part 222.

The length direction extension plate 224*b* may be shaped to have a step portion, and the mass body 240 may be bonded to and installed on the length direction extension plate 224*b*.

In addition, the vibration member 220 may be vibrated by deformation of the piezoelectric element 230, and a vibration state of the vibration member 220 may be changed depending on the vibration mode. As an example, the vibration mode may be composed of first and second vibration modes, and in the first vibration mode, the vibration member 220 may be vibrated at a first resonance frequency, and in the second vibration mode, the vibration member 220 may be vibrated at a second resonance frequency.

As an example, in the case in which the vibration member 220 is vibrated at the first resonance frequency, a maximum displacement portion of the vibration member 220 may be the other end portion of the installation part 222. Further, in the case in which the vibration member 220 is vibrated at the second resonance frequency, the maximum displacement portion of the vibration member 220 may be a distal end of the length direction extension plate 224*b*.

Meanwhile, a difference between the first and second resonance frequencies may be 50 Hz or more. Further, the first resonance frequency in the first vibration mode and the second resonance frequency in the second vibration mode may be in a range of 50 Hz to 400 Hz. In addition, the first resonance frequency may be lower than the second resonance frequency.

As described above, vibration may be implemented in a plurality of vibration modes through the vibration member 220 composed of the installation part 222 and the extension part 224. Further, since there is no bent portion in the installation part 222 and the extension part 224, a decrease in a response speed may be prevented. Further, a decrease in a vibration amount may be prevented by preventing a decrease in a length of the vibration member 220.

In other words, miniaturization and thinness of the vibration generating device 200 may be implemented, and at the same time, a decrease in the response speed may be prevented. In addition, vibration may be generated in the plurality of vibration modes.

The piezoelectric element 230 may be fixedly attached to the vibration member 220. As an example, the piezoelectric element 230 may be fixedly attached to the bottom surface of the installation part 222 of the vibration member 220 and have a bar shape. Further, in the case in which the piezoelectric element 230 is installed on the installation part 222, both side surfaces of the piezoelectric element 230 may be supported by the support protrusion 222*a*.

Meanwhile, the piezoelectric element 230 may be connected to a circuit board (not shown) and allow the vibration member 220 and the mass body 240 to be vibrated in the plurality of vibration modes. As an example, the vibration member 220 and the mass body 240 may be vibrated in the plurality of vibration modes depending on a deformation modes of the piezoelectric element 230.

The mass body 240 may be fixedly attached to the vibration member 220. As an example, the mass body 240 may be installed on an upper surface of the vibration member 220. Meanwhile, the mass body 240 may have a substantially rectangular parallelepiped shape.

In addition, an insertion groove 242 into which the installation part 222 is inserted may be formed in a bottom surface of the mass body 240, and the bottom surface 242*a* of the mass body 240 forming the insertion groove 242 may be inclined upwardly from a free end of the installation part 222 toward a fixed end thereof so as to prevent a contact with the installation part 222.

In addition, a stepped surface 244 for preventing a contact with the vibration member 220 may be formed at the other end portion of the bottom surface of mass body 240.

Meanwhile, the mass body 240 may be bonded to the length direction extension plate 224*b* to thereby be fixedly attached to the vibration member 220. As an example, the mass body 240 may be bonded to the length direction extension plate 224*b* via an adhesive member 246.

As described above, the bottom surface of the mass body 240 may be bonded to the vibration member 220 at a portion thereof facing the length direction extension plate 224*b* and spaced from the vibration member 220 at the other portions thereof.

As described above, in the vibration generating device, as vibration is implemented in the plurality of vibration modes, the decrease in the response speed may be prevented. Further, a decrease in the vibration amount caused by miniaturization and thinness may be suppressed.

As set forth above, according to exemplary embodiments of the present disclosure, even though the vibration generating device is driven in a plurality of vibration modes, a decrease in the response speed may be prevented.

While exemplary embodiments have been shown and described above, it will be apparent to those skilled in the art that modifications and variations could be made without departing from the scope of the present invention as defined by the appended claims.

What is claimed is:

1. A vibration generating device comprising:
- a housing having an internal space;
- a vibration member of which one end is fixedly attached to the housing;
- a piezoelectric element installed on the vibration member; and
- a mass body fixedly attached to the vibration member,
- wherein the vibration member includes:
  - an installation part on which the piezoelectric element is installed; and
  - an extension part extended from at least one side surface of the installation part,
- wherein the extension part of the vibration member includes:
  - a first extension part extended from one side surface of the installation part; and
  - a second extension part extended from the other side surface of the installation part,
- wherein the first extension part includes:
  - a first width direction extension plate extended from one side surface of the installation part; and
  - a first length direction extension plate extended from a distal end of the first width direction extension plate in a length direction of the installation part,
- wherein the second extension part includes:
  - a second width direction extension plate extended from the other side surface of the installation part; and
  - a second length direction extension plate extended from a distal end of the second width direction extension plate to be parallel with respect to the first length direction extension plate,
- wherein the mass body is bonded to the first and second length direction extension plates to be fixedly attached to the vibration members and
- wherein a maximum displacement portion of the vibration member is changed depending on a vibration mode.

2. The vibration generating device of claim 1, wherein the first and second length direction extension plates are shaped to have step portions.

3. The vibration generating device of claim 1, wherein the mass body is bonded to the first and second length direction extension plates via an adhesive member.

4. The vibration generating device of claim 1, wherein a support protrusion for supporting side surfaces of the piezoelectric element is provided on the installation part.

5. The vibration generating device of claim 1, wherein the housing includes an installation member to which the installation part is bonded.

6. The vibration generating device of claim 1, wherein the housing includes:

a case in which an internal space is provided and of which a lower end is open; and a bracket which is coupled to the lower end of the case.

7. The vibration generating device of claim 1, wherein;

the vibration member is deformed in first and second vibration modes, and a difference between resonance frequencies in the first and second vibration modes is 50 Hz or more.

8. The vibration generating device of claim 7, wherein the resonance frequencies in the first and second vibration modes are in a range of 50 Hz to 400 Hz.

9. A vibration generating device comprising;

a housing having an internal space:

a vibration member of which one end is fixedly attached to the housing;

a piezoelectric element installed on the vibration member; and a mass body fixedly attached to the vibration member, wherein the vibration member includes:

an installation part on which the piezoelectric element is installed; and an extension part extended from at least one side surface of the installation part, wherein the extension part of the vibration member includes:

a first extension part extended from one side surface of the installation part; and a second extension part extended from the other side surface of the installation part, wherein the first extension part includes:

a first width direction extension plate extended from one side surface of the installation part; and a first length direction extension plate extended from a distal end of the first width direction extension plate in a length direction of the installation part, wherein the second extension part includes:

a second width direction extension plate extended from the other side surface of the installation part; and a second length direction extension plate extended from a distal end of the second width direction extension plate to be parallel with respect to the first length direction extension plate, wherein a maximum displacement portion of the vibration member is changed depending on a vibration mode, and wherein an insertion groove into which the installation part is inserted is provided in a bottom surface of the mass body, and the bottom surface of the mass body is, inclined upwardly from a free end of the installation part toward a fixed end thereof so as to prevent a contact with the installation part.

10. A vibration generating device comprising:

a housing having an internal space;

a vibration member of which one end is fixedly attached to the housing;

a piezoelectric element installed on the vibration member; and a mass body fixedly attached to the vibration member, wherein the vibration member includes an installation part on which the piezoelectric element is installed, and an extension part extended from at least one side surface of the installation part, wherein a maximum displacement portion of the vibration member is changed depending on a vibration mode, wherein the extension part includes a width direction extension plate extended from one side surface of the installation part, and a length direction extension plate extended from a distal end of the width direction extension plate in a length direction of the installation part, and wherein the length direction extension plate is shaped to have a step portion, and the mass body is bonded to the length direction extension plate.

* * * * *